United States Patent [19]

Sakai et al.

[11] Patent Number: 4,697,203
[45] Date of Patent: Sep. 29, 1987

[54] SEMICONDUCTOR DEVICE AND MANUFACTURING METHOD THEREFOR

[75] Inventors: Kunito Sakai; Sadamu Matsuda; Takashi Takahama, all of Hyogo, Japan

[73] Assignee: Mitsubishi Denki Kabushiki Kaisha, Toyko, Japan

[21] Appl. No.: 741,051

[22] Filed: Jun. 4, 1985

[30] Foreign Application Priority Data

Jun. 4, 1984 [JP] Japan .................. 59-115871

[51] Int. Cl.[4] ............ H01L 23/06; H01L 23/30
[52] U.S. Cl. ............................ 357/72; 357/74; 174/52 PE
[58] Field of Search .......... 357/72, 74; 174/52 PE

[56] References Cited

FOREIGN PATENT DOCUMENTS

| 58-4953 | 1/1983 | Japan | 357/72 |
|---|---|---|---|
| 58-14553 | 1/1983 | Japan | 357/72 |
| 58-43543 | 3/1983 | Japan | 357/72 |
| 58-37939 | 3/1983 | Japan | 357/72 |
| 60-83351 | 5/1985 | Japan | 357/74 |

OTHER PUBLICATIONS

Licari, James J., *Plastic Coatings for Electronics*, McGraw-Hill, N.Y., pp. 14-23, 278-313.

*Primary Examiner*—Andrew J. James
*Assistant Examiner*—Jerome Jackson, Jr.
*Attorney, Agent, or Firm*—Sughrue, Mion, Zinn, Macpeak, and Seas

[57] ABSTRACT

A semiconductor device and a method for manufacturing a semiconductor device of a type having a resin package and a window in the package such as a quartz glass window transparent to ultraviolet rays. A semiconductor chip is bonded onto a surface of a die pad of a lead frame. A softened resin is then extruded from the opposite surface of the die pad through gaps between the die pad and the leads with the extrusion being carried out in an inert gas atmosphere. An inner package member is thus formed surrounding the semiconductor chip. An outer package member, made of a thermosetting resin having a weight ratio of resin to filler less than that of the inner package, is molded around the chip assembly and inner package.

7 Claims, 11 Drawing Figures

SEMICONDUCTOR DEVICE AND MANUFACTURING METHOD THEREFOR

BACKGROUND OF THE INVENTION

The present invention relates to a semiconductor device in which a semiconductor chip is sealingly encapsulated in resin, and particularly to such a device in which the resin encapsulates the semiconductor chip with a space therearound. The invention also relates to a method for fabricating such a device.

For packaging semiconductor chips, both resins and ceramic materials have commonly been used. The use of resin is preferred, however, for reasons of economy.

FIG. 1 shows a conventional semiconductor device in which a semiconductor chip 1, bonding wires 2, and a die pad 3 are directly covered with resin 4. Such a semiconductor device is fabricated by soldering the semiconductor chip 1 to the die pad 3, connecting lead wires 5 to electrodes of the semiconductor chip 1 via the bonding wires 2, disposing this assembly in a metal mold, and then encapsulating the assembly with resin 4.

Such a structure of a semiconductor device does not require any step of assembling solid members in sealing the semiconductor chip, contrarily to that using ceramic packaging, and thus it is suitable for mass production with the merit of low material costs.

On the other hand, however, since the semiconductor chip 1 is directly in contact with the resin 4, and the thermal expansion coefficient of the resin 4 is different from that of the semiconductor chip, stress is produced upon temperature variation, and as a result the contacts between the bonding wires 2 and the semiconductor chip may be degraded and/or cracks in the latter may occur, causing a malfunction of the semiconductor device. In view of this fact, having a member made of resin in direct contact with the chip is not recommendable for a semiconductor chip 1 which generates relatively large amounts of heat.

A semiconductor device including a package member of resin having an opening in one side thereof in which a semiconductor chip is inserted and a cover member of the same resin material for covering the opening and adapted to be bonded thereto, whereby the semiconductor chip is separated from the resin members, has been proposed in "Practical IC Techiques", page 137, FIG. 6.3(e), Nippon Microelectronics Association, Jan. 25, 1981.

The assembling procedure of the proposed semiconductor device is similar to that of the conventional device using ceramic members and, therefore, its productivity is as low as that of the device using ceramic members. Further, if the chip to be encapsulated by the resin package is a read-only memory erasable with ultraviolet rays, the cover member must be transparent to ultraviolet rays. However, no presently known resin material provides both satisfactory sealing and transparency to ultraviolet rays.

In order to overcome this problem, it may be considered to prepare the cover member using a material different from that of the package, such as quartz glass. However, since the thermal expansion coefficient of resin is considerably different from that of quartz glass, the seal between the package member and the cover member may be broken due to temperature variations during the assembling procedure, ambient temperature variations, and/or heat generation of the semiconductor chip in normal operation, and, in some cases, there may be cracks produced in either or both members. Therefore, it is usual to employ a ceramic package member having a thermal expansion coefficient substantially the same as that of the cover member of quartz glass. Thus, for the reason explained above, material costs are high and productivity low.

SUMMARY OF THE INVENTION

An object of the present invention is to provide a semiconductor device having a semiconductor chip packaged in a resin package member of the type having an opening through which the chip is inserted and a having cover member made of a material having a thermal expansion coefficient different from that of the package member for sealing the opening of the package member.

This and other objects of the present invention are met by a method for fabricating a semiconductor device by extruding a softened resin from the side of a surface of a lead frame, on the other surface of which a semiconductor chip is attached, through gaps between leads and a die pad of the lead frame.

In more detail, the invention provides a semiconductor device comprising a lead frame having a die pad and leads, a semiconductor chip bonded to one surface of the die pad, and a package member made of resin. The resin forming the package member fills gaps between the die pad and the leads and extends from the one surface such that the resin surrounds the semiconductor chip peripherally, leaving an opening above the semiconductor chip. A cover member is disposed over the opening, sealed thereto via a flexible film disposed between peripheral portions of the opening and peripheral portions of the cover member. The cover member may be formed of a material different from that of the resin. An inert gas fills the space around the semiconductor chip.

Further in accordance with the invention, a method for fabricating a semiconductor device is provided comprising steps of bonding a semiconductor chip onto a surface of a die pad of a lead frame including the die pad and leads, extruding a softened resin from the other surface of the die pad through gaps between the die pad and the leads in an inert gas atmosphere, and hardening an extruded resin to form a package member surrounding the semiconductor chip with a space around the semiconductor chip filled with inert gas.

DESCRIPTION OF THE PREFERRED EMBODIMENTS

An embodiment of the present invention will be described with reference to FIGS. 2 to 4.

Figure 1:
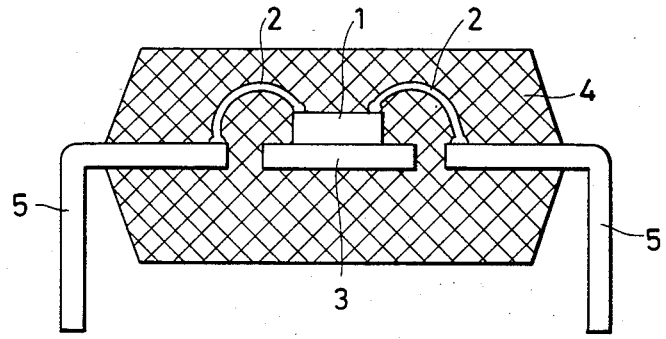
FIG. 1 is a cross-sectional view of a conventional semiconductor device having a resin package.
Figure 2:
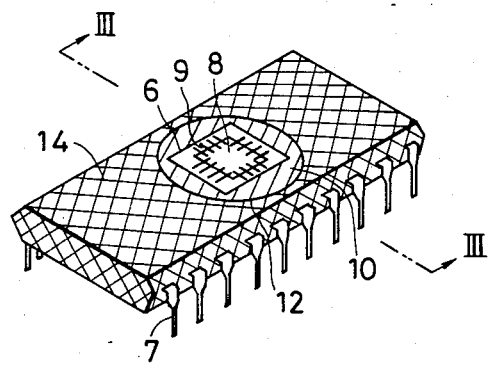
FIG. 2 is a perspective view of a preferred embodiment of a semiconductor device of the present invention.
Figure 3:
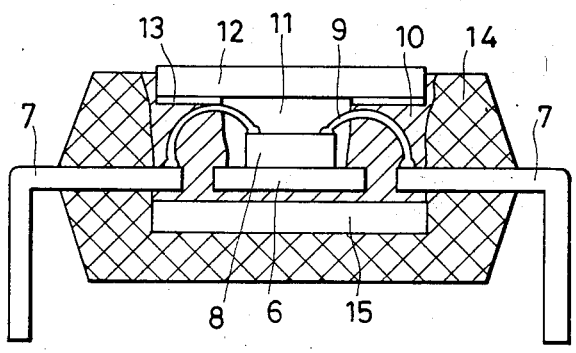
FIG. 3 is a cross section taken along a line III—III in FIG. 2.
Figure 4:
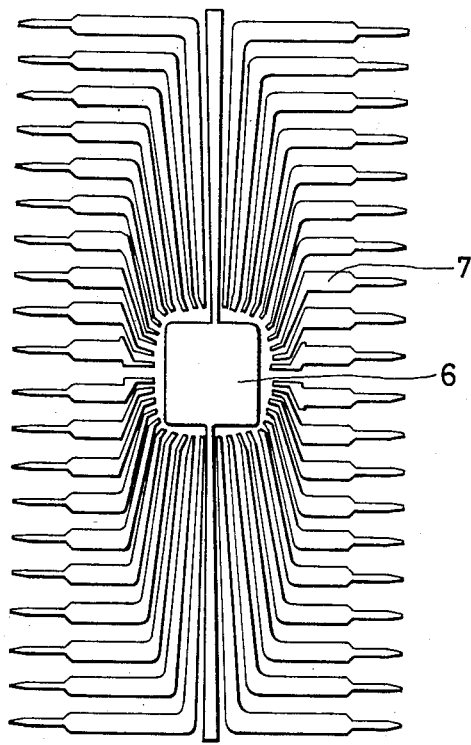
FIG. 4 is a plan view of an example of a lead frame having die pad.

In FIGS. 2 and 3, it is assumed that a semiconductor chip 8 of a semiconductor device is a readonly memory erasable by ultraviolet rays. The semiconductor device is provided with a lead frame including a die pad 6 having first and second, or top and bottom, surfaces and leads 7 which are patterned such as shown in FIG. 4. The semiconductor chip 8 is bonded by, for example, soldering, to a first surface of the die pad 6. Bonding wires 9 made of gold and having diameter of about 2 microns electrically connect the leads 7 to respective electrodes of the semiconductor chip 8. A first, or inner, package member 10 covers the second surface of the die pad 6 and partially covers the first surface thereof so as to leave an opening 11 above the chip 8. A cover member 12 closes the opening 11, sealed by a thin film 13, made of a resilient material such as rubber, disposed between peripheral portions of the members 10 and 12. A second, or outer, package member 14 encloses the first package member 10 and a flat plate 15 of a magnetic material such as nickel abutting the first package member 10. The plate 15 is electrically isolated from the die pad 6 and the leads 7 by the materials of the first and second package members 10 and 14.

The first package member 10 is made of a mixture of a thermosetting resin and an inorganic filler with a weight ratio of resin to filler being approximately 150:400. The thermosetting resin may be a mixture of a Novolak-type epoxy resin and a phenol Novolak hardening agent with a weight ratio of the resin to the agent being approximately 50:100. These constituent ratios are selected so that the thermal expansion coefficient of the first package member 10 is made close to $0.55 \times 10^{-6}/°$ C., which is the thermal expansion coefficient of quartz glass, of which the cover member 12 is formed.

The second package member 14 is formed of a mixture of thermosetting resin and an inorganic filler with a weight ratio of the resin to the filler being approximately 150:300, the thermosetting resin being the same as that used for the first package member 10, thus having a thermal expansion coefficient as usual for such a material.

With this construction of the semiconductor device, since the flexible film 13 is disposed between the cover member 12 and the first package member 10, any stress produced in either or both of the cover member and the first package member (whose thermal expansion coefficient may be slightly different from that of the cover member), due to heating during the manufacturing process, during normal use, or ambient temperature variations, is absorbed by the film 13. Consequently, the possibility of cracking of either member or degradation of the sealing effect is minimized.

Further, since the first package member 10 is formed of a material whose content of inorganic filler is much more than that of the material of the second package member 14 so that the difference in thermal expansion coefficients between the first package member 10 and the cover member 12 is reduced, the possibility of damage to the cover member 12 and/or degradation of the sealing effect is further reduced. In addition to the above points, since the content of inorganic filler of the resin material forming the second package member 14 is smaller than that of the first package member 10, and thus the waterproofing characteristic thereof is better than that of the first package member 10, the waterproofing characteristic of the resultant semiconductor device is not degraded by the use of the first package member 10. Moreover, since the semiconductor chip 8 is physically isolated from the first package member 10, there is no stress produced therebetween.

FIG. 5A to 5D show steps of manufacturing the semiconductor device having the structure described with reference to FIGS. 2 and 3.

Figure 5A:
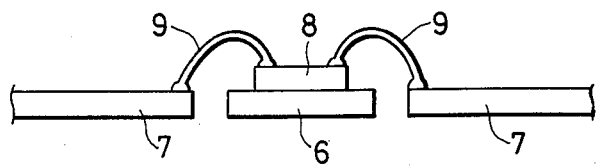
FIG. 5A through 5D show steps of manufacturing the semiconductor device shown in FIG. 2.

In FIG. 5A, the semiconductor chip 8 is bonded, by, for example, soldering, to one surface of the die pad 6 of the lead frame, and then electrodes of the semiconductor chip 8 are connected to respective ones of the leads 7 of the lead frame by the bonding wires 9.

Figure 5B:
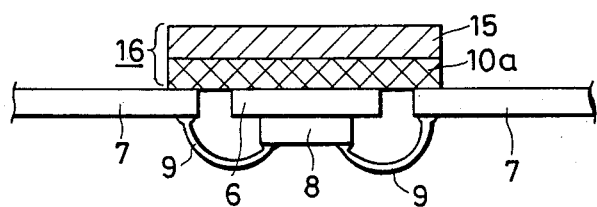

Then, the lead frame is turned upside down and a prepreg 16 composed of the flat plate 15 of magnetic material and a layer 10a of thermosetting resin containing a relatively large amount of inorganic filler laminated therewith is placed on the other surface of the die pad 6, as shown in FIG. 5B. Then, the prepreg 16 is heated to a temperature on the order of 80° C. so that the thermosetting resin of the layer 10a softens and flows, contacting the entire portion of the other surface of the die pad 6 and filling the gaps between the die pad 6 and the leads 7. Thereafter, the prepreg 16 is cooled to allow the resin to set.

Figure 5C:
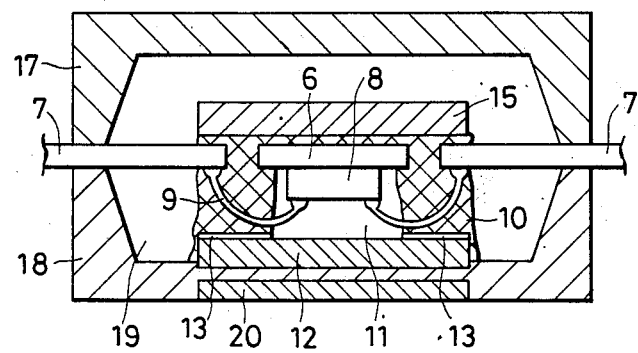

Next, the second package member 14 is formed and the cover member 12 assembled thereto using a metal mold as shown in FIG. 5C. The metal mold is composed of an upper mold half 17 and a lower mold half 18 with a molding cavity 19 being formed therebetween. The lower mold half 18 is provided in a lower portion thereof corresponding to the position of the flat plate 15 of the prepreg 16 to be disposed therein with a permanent magnet 20, and in a bottom surface thereof with a recess in which the cover member 12 is fitted with a gap therebetween sufficiently small as to prevent the flow of resin. The flexible film 13 is disposed on the cover member 12 such that the film covers the periphery of the cover member 12.

. The metal mold is preheated and the assembly of the lead frame, the semiconductor chip 8, the bonding wires 9, and the prepreg 16 is disposed on the flexible film 13. Then, the upper mold half 17 is positioned as shown in FIG. 5C. Following this step, the cavity of the metal mold is filled with an inert gas.

The resin 10a of the prepreg 16 is then heated by the metal mold. When the temperature of the resin 10a reaches about 80° C., it softens, and when the temperature of the resin 10a reaches about 180° C., a setting reaction is started. While the resin is soft, it is extruded down to the flexible film 13 on the cover member 12 through the gaps between the die pad 6 and the leads 7 by gravity and with the aid of the weight of the flat plate 15 and a magnetic attractive force acting between the flat plate 15 and the magnet 20, leaving a space around the semiconductor chip 8 filled with the inert gas, under a balance of a pressure of the inert gas in the space and the surface tension of the resin 10a. The setting reaction may be completed within several tens of seconds. Thus, the first package member 10 is formed, without contact between the resin and the semiconductor chip 8 or the cover member 12, the latter sealing the opening 11 of the first package member 10 through the flexible film 13.

Figure 5D:
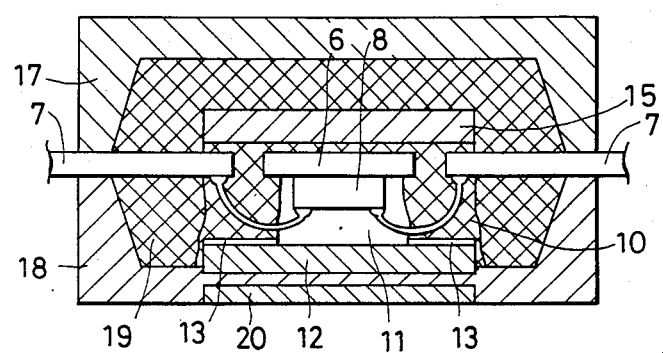

Next, the second package member 19 is molded in such a manner that it surrounds the first package member 10, but not the cover member 12, as shown in FIG. 5D.

Although the thermosetting resin for forming the first and second package members is mixture of Novolak-type epoxy resin and a phenol Novolak hardening agent in the above-described embodiment, it is possible to use a mixture of a bisphenol-type or cyclo-type epoxy resin and a hardening agent of an amine group or an acid anhydride. The inorganic filler mixed with the thermosetting resin may be glass cloth or the like. Further, it is possible to use a thermoplastic resin such as polyphenylene sulfide, polypropylene, polyethylene, or polyvinyl chloride instead of the thermosetting resin for forming the first and/or second package members. However, if thermoplastic resin is used for the first package member 10, careful control of temperature is necessary in forming the second package member 14 so that the first package member 10 is not softened to the extent that the opening 11 collapses during the formation of the second package member 14.

The permanent magnet 20 may be replaced by an electromagnet, and the extrusion of the resin of the prepreg 16 can be carried out other than with a combination of magnetic force and gravity.

Figure 6A:
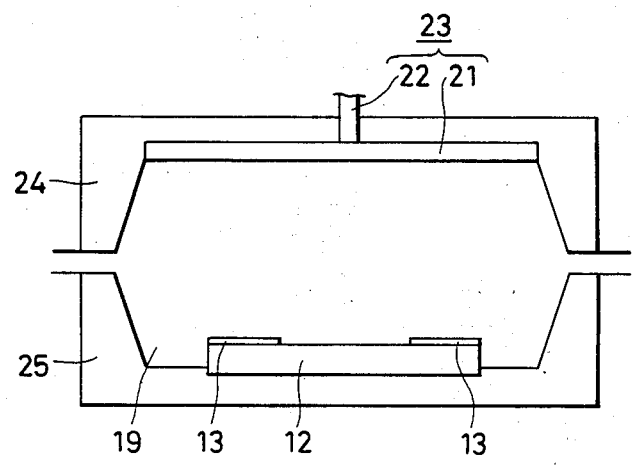
FIG. 6A through 6C show steps of manufacturing another embodiment of a semiconductor device of the present invention.
Figure 6B:
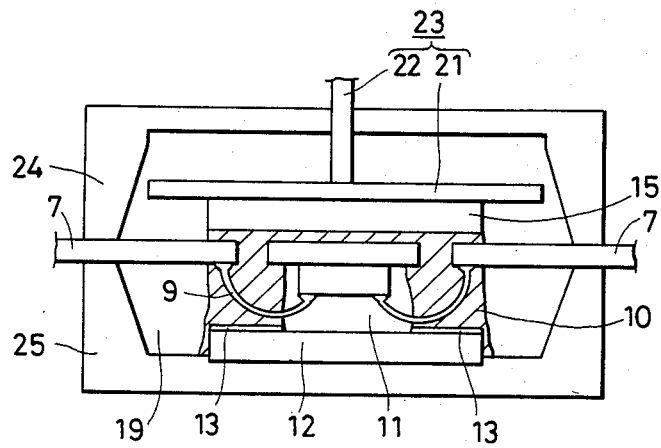
Figure 6C:
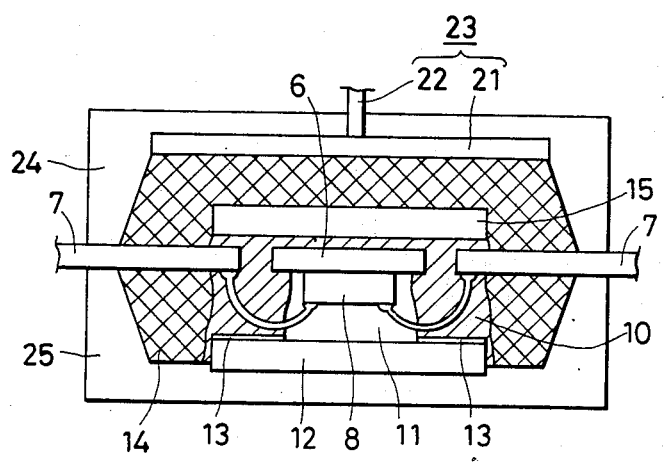

FIGS. 6A to 6C show another embodiment of the invention in which the extrusion of the resin of the prepreg 16 is performed using a pressure device 23. In FIG. 6A, an upper mold half 24 is formed with a center hole, and the pressure device 23 is composed of a pressure plate 21 and a shaft 22 which passes through the center hole. A lower mold half 25 is the same as the lower mold half 18 except that it has no magnet corresponding to the magnet 20.

The assembly is placed in the mold in the same way as described with reference to the previous embodiment. In this case, extrusion is performed by lowering the pressure plate 21 so that the latter presses down the flat plate 15 of the prepreg 16 as shown in FIG. 6B. Then, after the pressure plate 21 is lifted and the molding of the second package member 14 is carried out, as shown in FIG. 6C.

As mentioned previously, the cover member 12 is made of quartz glass since the semiconductor chip 8 is a read-only memory of the ultraviolet-ray erasable type. However, if the semiconductor chip 8 is of a type which requires no such transparent cover member, the chip 8 may be enclosed by only the resin of the prepreg 16. In such a case, it may be necessary to make the surface tension of the softened resin smaller or to externally apply a pressure higher than that of the inert gas sealed in the space around the chip 8 subsequent to the formation of the space. By doing so, the lower end portion of the softened resin may fill around the bottom of the lower mold half to close the inert gas filled space.

As mentioned hereinbefore, in the semiconductor device according to the present invention, a flexible film is disposed between the cover member and the peripheral edge portion of the opening of the resin package which surrounds the semiconductor chip with a space therearound. Therefore, any deformation due to differences in thermal expansion coefficients between the cover member and the package member will be absorbed, and thus cracking of either member and/or peeling of the cover member from the package member is prevented, thereby significantly improving the reliability of the semiconductor device.

Since the package member is formed by extruding resin from the rear surface of the lead frame, on the front surface of which the semiconductor chip is disposed, through the gaps between the die pad and the leads of the lead frame, the manufacture of the semiconductor device is facilitated.

We claim:

1. A semiconductor device comprising: a die pad (6) having a semiconductor chip (8) mounted on a first surface of the die pad; leads (7) separated by a gap from said die pad and connected through lead wires (9) to respective electrodes formed on a top surface of said semiconductor chip; a first, inner package number (10) of resin, said first package member forming an opening (11) above the first surface of said die pad, said resin filling the gaps between said leads and said die pad and covering a second, opposite surface of said die pad so that said semiconductor chip on said first surface of said die pad is peripherally surrounded by, but not in contact with, said first package member; an inert gas filling said opening; a second, outer package member (14) of a resin having a thermal expansion coefficient different from that of said resin forming said first package member, said second package member extending below and peripherally surrounding said first package member; and a cover member (12) sealingly closing said opening of said first package member.

2. The semiconductor device as recited in claim 1, wherein said cover member is made of a material transparent to light, and wherein said resin forming said first package member has a thermal expansion coeffecient smaller than that of said resin forming said second package member, and at least close to the thermal expansion coefficient of said material forming said cover member.

3. The semiconductor device as recited in claim 1, wherein each of said resins forming said first and second package members is a mixture of a thermosetting resin and an inorganic filler, and the percentage weight of filler is greater in the first package than in the second package.

4. The semiconductor device as recited in claim 3, where a weight ratio of resin to filler of said inner package is approximately 150:400, and a weight ratio of resin to filler of said outer package is approximately 150:300.

5. The semiconductor device as recited in claim 2, further comprising a resilient thin film (13) disposed between a top portion of said first package member and a bottom peripheral portion of said cover member.

6. The semiconductor device as recited in claim 5, wherein a bottom portion of the cover member is in contact with the thin film, and side surfaces of the cover member are in contact with the first package member.

7. The semiconductor device as recited in claim 6, wherein said semiconductor chips is a read-only memory element of an ultraviolet ray erasable type, and said cover member is made of a material transparent to ultraviolet rays.

* * * * *